(12) United States Patent
Robin et al.

(10) Patent No.: US 10,615,299 B2
(45) Date of Patent: Apr. 7, 2020

(54) OPTOELECTRONIC DEVICE WITH THREE-DIMENSIONAL SEMICONDUCTOR ELEMENTS

(71) Applicants: Commissariat à l'Énergie Atomique et aux Énergies Alternatives, Paris (FR); Aledia, Grenoble (FR)

(72) Inventors: Ivan-Christophe Robin, Grenoble (FR); Amélie Dussaigne, Bizonnes (FR); Guy Feuillet, Saint Martin D'uriage (FR); Stéphanie Gaugiran, Grenoble (FR)

(73) Assignees: Commissariat à l'Énergie Atomique et aux Énergies Alternatives, Paris (FR); Aledia, Grenoble (FR)

( * ) Notice: Subject to any disclaimer, the term of this patent is extended or adjusted under 35 U.S.C. 154(b) by 0 days.

(21) Appl. No.: 15/513,797

(22) PCT Filed: Sep. 29, 2015

(86) PCT No.: PCT/FR2015/052602
§ 371 (c)(1),
(2) Date: Mar. 23, 2017

(87) PCT Pub. No.: WO2016/051078
PCT Pub. Date: Apr. 7, 2016

(65) Prior Publication Data
US 2018/0233610 A1    Aug. 16, 2018

(30) Foreign Application Priority Data

Sep. 30, 2014 (FR) ..................... 14 59275

(51) Int. Cl.
*H01L 33/00* (2010.01)
*H01L 31/0352* (2006.01)
(Continued)

(52) U.S. Cl.
CPC ...... *H01L 31/035209* (2013.01); *H01L 33/06* (2013.01); *H01L 33/18* (2013.01); *H01L 33/22* (2013.01); *H01L 33/24* (2013.01)

(58) Field of Classification Search
None
See application file for complete search history.

(56) References Cited

U.S. PATENT DOCUMENTS 8,138,493 B2    3/2012  Ohlssone et al.
2005/0269286 A1*  12/2005  Sharma ............... B82Y 10/00
                                                    216/11
(Continued)

FOREIGN PATENT DOCUMENTS

EP        2333847 A1    6/2011

OTHER PUBLICATIONS

International Search Report for Application No. PCT/FR2015/052602 dated Jan. 18, 2016.
(Continued)

*Primary Examiner* — Reema Patel
(74) *Attorney, Agent, or Firm* — Wolf, Greenfield & Sacks, P.C.

(57) ABSTRACT

An optoelectronic device including three-dimensional semiconductor elements predominantly made of a first compound selected from among the group consisting of Compounds III-V, Compounds II-VI, and Compounds IV. Each semiconductor element defines, optionally with insulating portions partially covering said semiconductor element, at least one first surface including contiguous facets angled relative to each other. The optoelectronic device includes quantum dots at least some of the seams between the facets. The quantum dots are predominantly made of a mixture of the (Continued)

first compound and an additional element and are suitable for emitting or receiving a first electromagnetic radiation at a first wavelength.

12 Claims, 3 Drawing Sheets

(51) Int. Cl.
*H01L 33/06* (2010.01)
*H01L 33/18* (2010.01)
*H01L 33/22* (2010.01)
*H01L 33/24* (2010.01)

(56) References Cited

U.S. PATENT DOCUMENTS

| | | |
|---|---|---|
| 2010/0006817 A1 | 1/2010 | Ohlsson et al. |
| 2010/0259184 A1* | 10/2010 | Kato ............... H01L 33/08 315/291 |
| 2011/0169025 A1* | 7/2011 | Kishino ............ B82Y 20/00 257/89 |
| 2012/0205613 A1 | 8/2012 | Mi et al. |
| 2013/0200334 A1* | 8/2013 | Zhang .............. H01L 33/04 257/13 |
| 2014/0138620 A1* | 5/2014 | Svensson .......... H01L 33/007 257/13 |

OTHER PUBLICATIONS

International Preliminary Report on Patentability for Application No. PCT/FR2015/052602 dated Jan. 18, 2016.

* cited by examiner

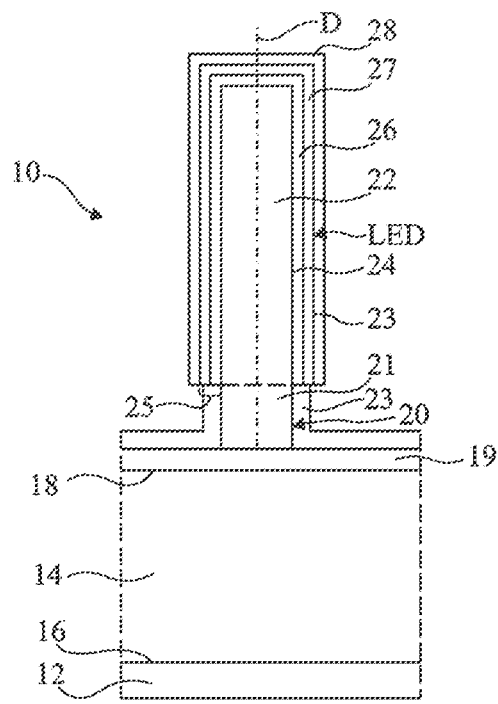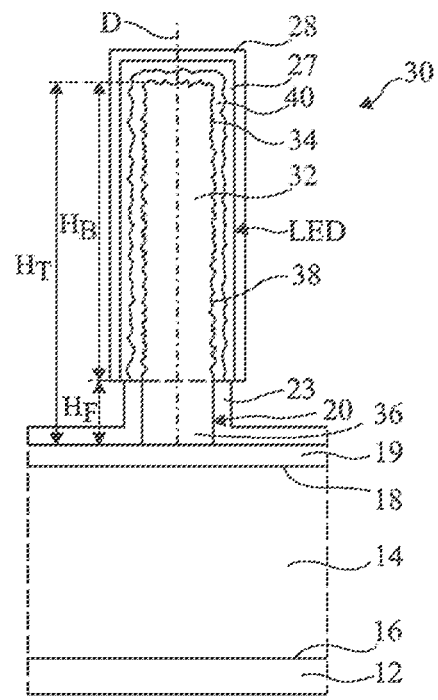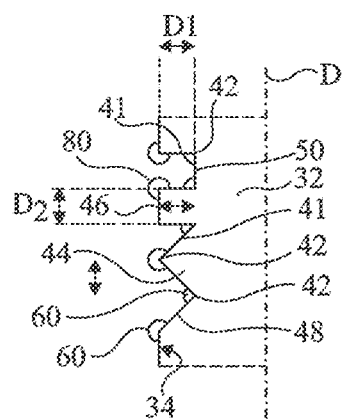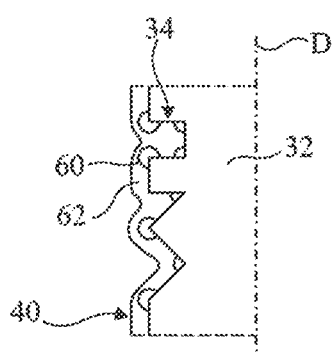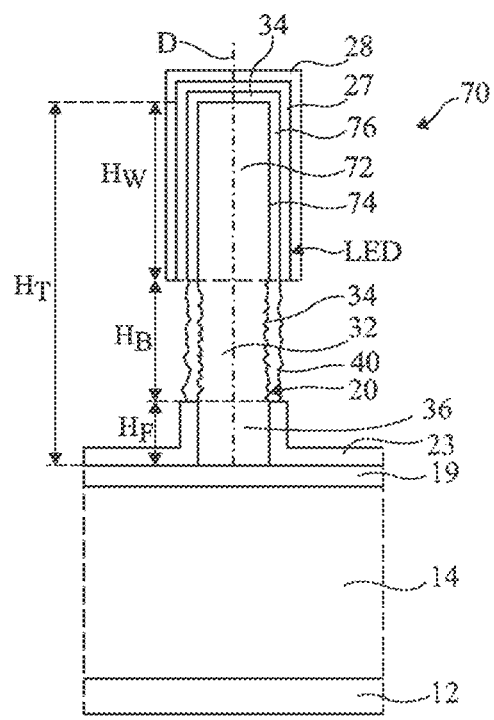
Fig 1 (PRIOR ART)
Fig 2
Fig 3
Fig 4
Fig 5

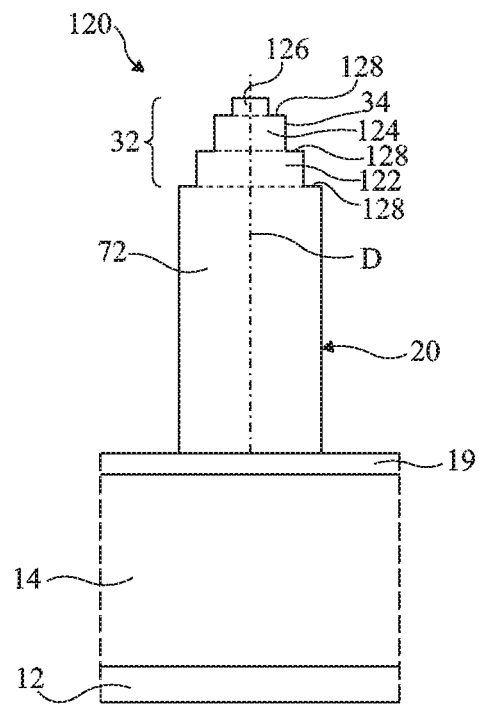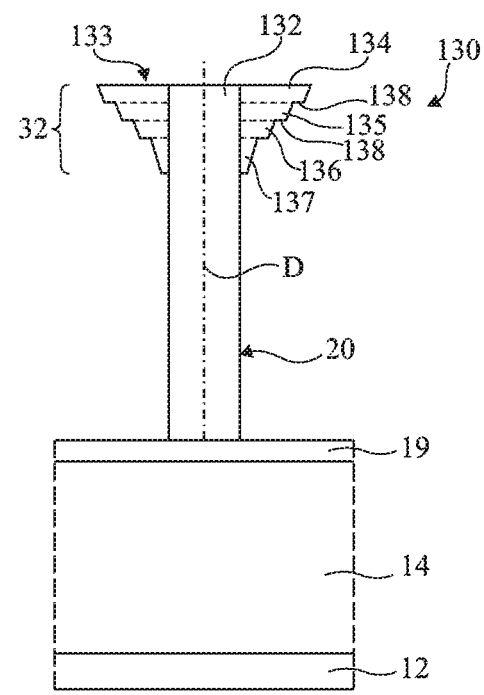
Fig 10  Fig 11
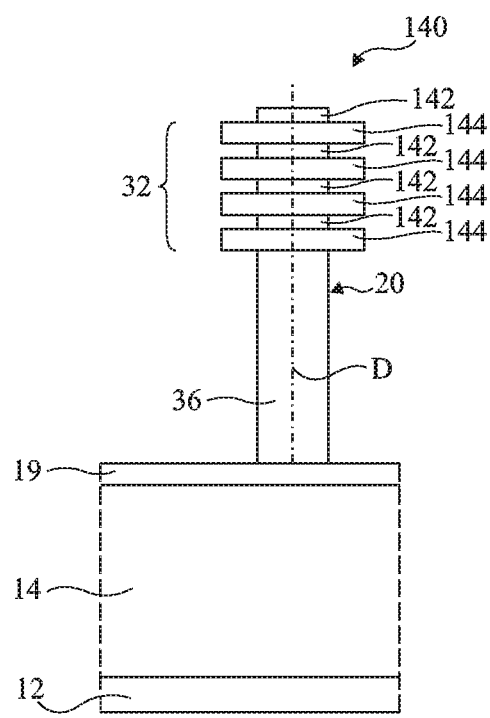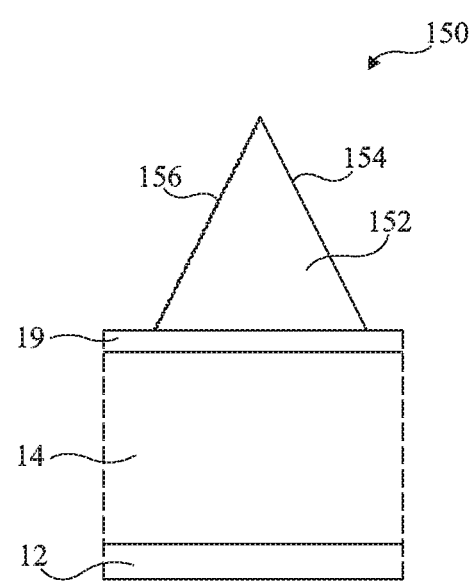
Fig 12  Fig 13

OPTOELECTRONIC DEVICE WITH THREE-DIMENSIONAL SEMICONDUCTOR ELEMENTS

CROSS-REFERENCE TO RELATED APPLICATIONS

This application is the national phase of International Application No. PCT/FR2015/052602, filed on Sep. 29, 2015, which claims priority to French Patent Application No. 14/59275, filed Sep. 30, 2014, each of which applications is incorporated herein by reference to the maximum extent allowable.

The present patent application claims the priority benefit of French patent application FR14/59275 which will be incorporated herein by reference.

BACKGROUND

The present invention generally relates to optoelectronic devices made from semiconductor materials and to methods of manufacturing the same.

Term "optoelectronic devices" is used to designate devices capable of converting an electric signal into an electromagnetic radiation or the other way, and especially devices dedicated to detecting, measuring, or emitting an electromagnetic radiation or devices dedicated to photovoltaic applications.

DISCUSSION OF THE RELATED ART

Radial-type optoelectronic devices comprising three-dimensional semiconductor elements and an active area formed at the periphery of each three-dimensional element are here more particularly considered. The region from which most of the electromagnetic radiation supplied by the optoelectronic device is emitted or where most of the electromagnetic radiation received by the optoelectronic device is captured is called active area of the optoelectronic device.

Examples of three-dimensional elements are microwires or nanowires comprising a semiconductor material based on a compound mainly comprising at least one group-III element and one group-V element (for example, gallium nitride GaN), called III-V compound hereafter, or mainly comprising at least one group-II element and one group-VI element (for example, zinc oxide ZnO), called II-VI compound hereafter. Such devices are for example described in French patent applications FR 2995729 and FR 2997558.

Three-dimensional elements, particularly semiconductor microwires or nanowires, are generally formed on a substrate and each three-dimensional element is at least partially covered with a semiconductor structure comprising an active area capable of emitting or of sensing an electromagnetic radiation. It is known to form an active area comprising a single quantum well or multiple quantum wells. A single quantum well is formed by interposing, between two layers of a first semiconductor material, for example, a III-V compound, particularly GaN, respectively P- and N-type doped, a layer of a second semiconductor material, for example, an alloy of the III-V or II-VI compound and of a third element, particularly, InGaN, having a different bandgap than the first doped material. A multiple quantum well structure comprises a stack of semiconductor layers forming an alternation of quantum wells and of barrier layers.

The wavelength of the electromagnetic radiation emitted or captured by the optoelectronic device particularly depends on the bandgap of the second material forming the quantum well. When the second material is an alloy of the III-V or II-VI compound and of a third element, for example, InGaN, the wavelength of the emitted or captured radiation particularly depends on the atomic percent of the third element, for example, indium. In particular, the higher the atomic percent of indium, the higher the wavelength.

A disadvantage is that when the atomic percent of indium exceeds a threshold, lattice parameter differences can be observed between the GaN and InGaN of the quantum well, which may cause the forming of non-radiative defects in the active area, such as dislocations, which causes a significant decrease in the quantum efficiency of the active area of the optoelectronic device. There thus is a maximum wavelength of the radiation emitted or captured by an optoelectronic device having its active area comprising a single quantum well or multiple quantum wells made from III-V or II-VI compounds.

However, the use of materials made from III-V or II-VI compounds is desirable since there exist methods of growing by epitaxy such materials on substrates of large dimensions and at a low cost.

SUMMARY

Thus, an object of an embodiment is to overcome at least part of the disadvantages of the previously-described optoelectronic devices and of their manufacturing methods.

Another object of an embodiment is to increase the wavelength of the electromagnetic radiation capable of being emitted or captured by the optoelectronic device.

Another object of an embodiment is for the active area of the optoelectronic device to comprise a stack of semiconductor materials made from III-V or II-VI compounds.

Another object of an embodiment is to control the wavelength of the electromagnetic radiation capable of being emitted or captured by the optoelectronic device.

Thus, an embodiment provides an optoelectronic device comprising three-dimensional semiconductor elements predominantly made of a first compound selected from the group comprising III-V compounds, II-VI compounds, and IV compounds, each semiconductor element delimiting, optionally with insulating portions partially covering said semiconductor element, at least one first surface comprising contiguous facets angled with respect to one another, the optoelectronic device comprising quantum dots at at least some of the seams between facets, the quantum dots being predominantly made of a mixture of the first compound and of an additional element and being capable of emitting or of receiving a first electromagnetic radiation at a first wavelength.

According to an embodiment, the device further comprises an active layer comprising at least a single quantum well or multiple quantum wells and capable of emitting or of receiving a second electromagnetic radiation at a second wavelength different from the first wavelength.

According to an embodiment, the device further comprises a second surface, distinct from the first surface, said active layer covering the second surface.

According to an embodiment, the active layer covers the quantum dots.

According to an embodiment, each quantum dot is predominantly made of a $In_xAl_yGa_{1-x-y}N$ compound, where $0 \leq x \leq 1$, $0 \leq y \leq 1$ and $1-x-y>0$.

According to an embodiment, the semiconductor elements are nanowires, microwires, and/or nanometer- or micrometer-range pyramidal structures.

According to an embodiment, the semiconductor elements have a shape elongated along a preferred direction, and the distance, measured perpendicularly to the preferred direction, between two seams of pairs of adjacent seams is greater than 5 nm.

According to an embodiment, the distance, measured parallel to the preferred direction, between two adjacent seams is shorter than 1 µm.

According to an embodiment, the density of seams is greater than $10^8$ seams/cm$^2$.

Another embodiment also provides a method of manufacturing an optoelectronic device comprising the steps of:

forming three-dimensional semiconductor elements predominantly made of a first compound selected from the group comprising III-V compounds, II-VI compounds, and IV compounds, each semiconductor element delimiting, optionally with insulating portions partially covering said semiconductor element, at least a first surface comprising contiguous facets angled with respect to one another; and forming quantum dots at at least some of the seams between facets, the quantum dots being predominantly made of a mixture of the first compound and of an additional element and being capable of emitting or of receiving a first electromagnetic radiation at a first wavelength.

According to an embodiment, the method further comprises forming an active layer comprising at least a single quantum well or multiple quantum wells and capable of emitting or of receiving a second electromagnetic radiation at a second wavelength different from the first wavelength.

According to an embodiment, the method further comprises forming the semiconductor elements and partially etching the semiconductor elements to form the first surface.

According to an embodiment, the first surface is formed simultaneously to the growth of the semiconductor elements.

BRIEF DESCRIPTION OF THE DRAWINGS

The foregoing and other features and advantages will be discussed in detail in the following non-limiting description of specific embodiments in connection with the accompanying drawings, among which:

FIG. 1 is a partial simplified cross-section view of an example of an optoelectronic device comprising microwires or nanowires;

FIG. 2 is a partial simplified cross-section view of an embodiment of an optoelectronic device comprising microwires or nanowires;

FIGS. 3 and 4 are partial simplified enlarged views illustrating an embodiment of an active area comprising quantum dots;

FIGS. 5 to 9 are partial simplified cross-section views of embodiments of optoelectronic devices comprising microwires or nanowires; and FIGS. 10 to 13 are partial simplified cross-section views of structures obtained at an intermediate step of the manufacturing of embodiments of optoelectronic devices comprising microwires or nanowires.

DETAILED DESCRIPTION

Figure 6:
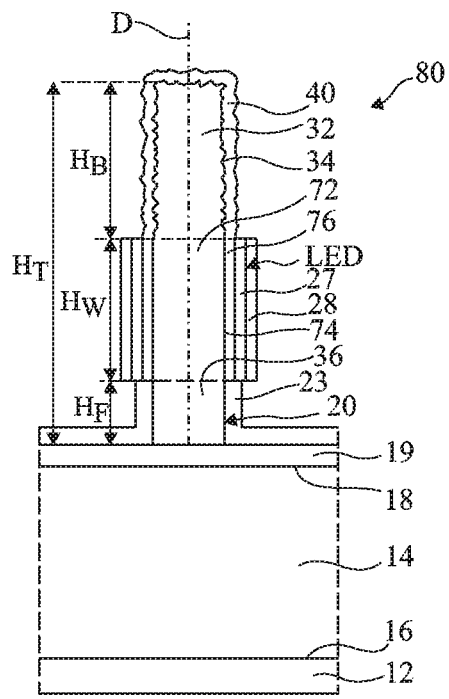

For clarity, the same elements have been designated with the same reference numerals in the various drawings and, further, as usual in the representation of electronic circuits, the various drawings are not to scale. Further, only those elements which are useful to the understanding of the present description have been shown and will be described.

In particular, the means for controlling the optoelectronic device described hereafter are within the abilities of those skilled in the art and are not described. In the following description, unless otherwise indicated, terms "substantially", "approximately", and "in the order of" mean "to within 10%".

The present description relates to optoelectronic devices comprising semiconductor elements having the shape of microwires, of nanowires, or of pyramids.

Term "microwire" or "nanowire" designates a three-dimensional structure having an elongated shape, for example, cylindrical, conical, or tapered, along a preferred direction, having at least two dimensions, called minor dimensions, in the range from 5 nm to 2.5 µm, preferably from 50 nm to 2.5 µm, the third dimension, called major dimension, being greater than or equal to 1 time, preferably greater than or equal to 5 times, and more preferably still greater than or equal to 10 times, the largest minor dimension. In certain embodiments, the minor dimensions may be smaller than or equal to approximately 1 µm, preferably in the range from 100 nm to 1 µm, more preferably from 100 nm to 800 nm. In certain embodiments, the height of each microwire or nanowire may be greater than or equal to 500 nm, preferably in the range from 1 µm to 50 µm.

In the following description, term "wire" is used to mean "microwire or nanowire". Preferably, the median line of the wire which runs through the centers of gravity of the cross-sections, in planes perpendicular to the preferred direction of the wire, is substantially rectilinear and is called "axis" of the wire hereafter. The base of the wire for example has an oval, circular, or polygonal shape, particularly triangular, rectangular, square, or hexagonal.

In the following description, term pyramid or truncated pyramid designates a three-dimensional structure having a pyramidal shape. The pyramidal structure may be truncated, that is, the top of the cone is absent and replaced with a flat area. The base of the pyramid is inscribed within a polygon having a side dimension from 100 nm to 10 µm, preferably from 1 to 3 µm. The polygon forming the base of the pyramid may be a hexagon. The height of the pyramid between the base of the pyramid and the apex or the top plateau varies from 100 nm to 20 µm, preferably from 1 µm to 10 µm.

In the following description, embodiments will be described in the case of an optoelectronic device comprising light-emitting diodes. It should however be clear that these embodiments may concern other applications, particularly devices dedicated to the detection or to the measurement of an electromagnetic radiation or devices dedicated to photovoltaic applications.

FIG. 1 is a partial simplified cross-section view of an optoelectronic device 10 formed from wires such as previously described and capable of emitting an electromagnetic radiation.

Device 10 comprises, from bottom to top in FIG. 1:
 a first biasing electrode 12;
 a substrate 14, for example, semiconductor, comprising parallel surfaces 16 and 18, surface 16 being in contact with electrode 12;
 a nucleation layer 19 covering surface 18;
 semiconductor elements 20, which in the present embodiment correspond to wires, a single wire 20 of axis D being shown, each wire 20 being capable of comprising a lower portion 21, in contact with substrate 19, continued by an upper portion 22;
 an insulating layer 23 covering substrate 19 and the periphery of the lower portion 21 of each wire 20;

a shell 25 covering the outer wall 24 of the upper portion 22 of each wire 20, shell 25 comprising at least one stack of an active area 26 covering upper portion 22 and of a semiconductor layer 27 covering active area 26; and a second electrode layer 28 covering each shell 25.

The assembly formed by a wire 20 and shell 25 forms a light-emitting diode LED. When a plurality of light-emitting diodes LED are formed on substrate 14, they may be connected in series and/or in parallel and form an assembly of light-emitting diodes. The assembly may comprise from a few light-emitting diodes LED to some thousand light-emitting diodes LED.

Active area 26 is the region from which most of the radiation provided by device 10 is emitted. Active area 26 may comprise confinement means. As an example, area 26 may comprise a single quantum well. It then comprises a semiconductor material different from the semiconductor material forming upper portion 22 and layer 27 and having a bandgap smaller than that of the material forming upper portion 22 and layer 27. Active area 26 may comprise multiple quantum wells. It then comprises a stack of semiconductor layers forming an alternation of quantum wells and of barrier layers.

The outer wall 24 of wires 20 generally corresponds to substantially smooth crystal planes. Active area 26, having a monolayer or multilayer structure, is generally formed in one or a plurality of steps of epitaxial deposition on outer wall 24.

Device 10 described in FIG. 1 operates properly but has various disadvantages. Indeed, the wavelength of the radiation emitted by active area 26 depends on the material used to form the single quantum well or the multiple quantum wells. For example, in the case where active area 26 comprises a InGaN-type alloy, the wavelength of the emitted radiation particularly depends on the proportion of indium. However, the internal quantum efficiency of active area 26 drops when the atomic proportion of indium exceeds 16%, which corresponds to a 460-nm emission wavelength.

The inventors have shown that when outer wall 24 of wire 20, rather than being smooth, comprises facets angled with respect to one another, quantum dots may be formed at the level of seams between the facets. A quantum dot is a semiconductor structure of nanometer-range dimension. It behaves as a potential well which confines electrons and holes in the three dimensions of space, in a region having a size in the order of the electron wavelength, that is, a few tens of nanometers in a semiconductor. It thus is a structure different from a quantum well, which confines the electrons and the holes in a single direction. The inventors have shown that quantum dots can enable the emission of a radiation at a different wavelength, and particular at a higher wavelength, than the wavelength of the radiation emitted by a quantum well.

FIG. 2 is a partial simplified cross-section view of an embodiment of an optoelectronic device 30. Optoelectronic device 30 comprises the same elements as optoelectronic device 10 shown in FIG. 1, with the difference that upper portion 22 is replaced with a wire portion 32 having an outer lateral wall 34 which is uneven or rough, that is, with asperities. Lower portion 21 of each wire 20 may further also be replaced with a portion 36 having an outer lateral wall which is optionally rough. Call $H_T$ the total height of wire 20, $H_B$ the height of wire portion 32 having a rough outer wall 34, and $H_F$ the height of lower portion 36. Active area 26 of device 10 is, further, replaced with an active area 40 formed on rough wall 34. Active area 40 comprises quantum dots.

Semiconductor elements 20 are at least partly made of at least one semiconductor material. The semiconductor material is selected from the group comprising III-V compounds, II-VI compounds, or group-IV semiconductors or compounds.

Semiconductor elements 20 may be at least partly made of semiconductor materials mainly comprising a III-V compound, for example, a III-N compound. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

Semiconductor elements 20 may be at least partly made from semiconductor materials mainly comprising a II-VI compound. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions.

Semiconductor elements 20 may be at least partly made of semiconductor materials mainly comprising at least one group-IV compound. Examples of group-IV semiconductor materials are silicon (Si), carbon (C), germanium (Ge), silicon carbide alloys (SiC), silicon-germanium alloys (SiGe), or germanium carbide alloys (GeC).

Semiconductor elements 20 may comprise a dopant. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C), or a group-IV N-type dopant, for example, silicon (Si), germanium (Ge), selenium (Se), sulfur (S), terbium (Tb), or tin (Sn).

When the three-dimensional semiconductor elements 20 of the optoelectronic device correspond to wires, height $H_T$ may be in the range from 250 nm to 50 μm. Each wire 20 may have a semiconductor structure elongated along an axis substantially perpendicular to surface 18. Each wire 20 may have a generally cylindrical shape with an oval, circular, or polygonal base, particularly triangular, rectangular, square, or hexagonal. The axes of two adjacent wires 20 may be distant by from 0.5 μm to 10 μm and preferably from 1.5 μm to 5 μm. As an example, wires 20 may be regularly distributed, particularly in a hexagonal network.

According to an embodiment, the lower portion 36 of each wire is predominantly made of a III-N compound, for example, gallium nitride, doped with a first conductivity type, for example, N-type doped. The N-type dopant may be silicon. Height $H_F$ of lower portion 21 may be in the range from 500 nm to 25 μm.

According to an embodiment, portion 32 of each wire is for example at least partly made of a III-N compound, for example, gallium nitride. Portion 32 may be doped with the first conductivity type, for example, type N, or not be intentionally doped. Height $H_B$ of upper portion 32 may be in the range from 500 nm to 25 μm.

As a variation, for each wire 20, insulating layer 23 may extend over part of portion 32, not extend over the entire lower portion 36, or extend on part of active area 40.

When the three-dimensional semiconductor elements 20 of optoelectronic device 10 correspond to pyramids, the height of each pyramid may be in the range from 100 nm to 25 µm. Each pyramid may have a semiconductor structure elongated along an axis substantially perpendicular to surface 18. The base of each pyramid may have a general shape of oval, circular, or polygonal type, particularly triangular, rectangular, square, or hexagonal. The centers of two adjacent pyramids may be distant by from 0.25 µm to 10 µm and preferably from 1.5 µm to 5 µm. As an example, the pyramids may be regularly distributed, particularly in a hexagonal network.

In the case of a wire 20 predominantly made of GaN, the crystal structure of the wire may be of wurtzite type, the wire extending along crystallographic direction C.

For each semiconductor element 20, active area 40 comprises quantum dots of a material mainly comprising a III-V compound, a II-VI compound, or a IV compound having an additional element incorporated therein.

FIG. 3 is a partial simplified enlarged view of an embodiment of rough lateral wall 34 of portion 32 of the wire at a first step of an embodiment of a method of manufacturing active area 40. Wall 34 comprises a succession of contiguous facets 41 which are connected to one another by seams, corresponding to corners or to edges 42. Corners or edges 42 may be "raised" or "recessed". As an example, a "raised" corner may correspond to the top of an asperity 44 and a "raised" edge 42 may correspond to the edge of a raised plateau 46. A "recessed" corner 42 may correspond to the bottom of a recess 48. A "recessed" edge 42 may correspond to the edge of a recessed plateau 50.

According to another embodiment, insulating portions partially cover portion 32 of wire 20 and expose areas of portion 32 of wire 20. Rough wall 34 is then formed by portion 32 of wire 20 covered with the insulating portions. The facets then belong to portion 32 of the wire or to insulating portions and the seams particularly correspond to the edges of the exposed areas of portion 32 of wire 20.

The inventors have shown that, when the roughness of wall 34 has specific properties and when the same epitaxial growth conditions as those of the quantum wells of active area 26 of device 10 are implemented in the presence of rough wall 34, quantum dots 60 first form at the level of the recessed edges or corners 42, and possibly at the level of the raised edges or corners 42. Edges or corners 42 then form sites of growth of quantum dots 60.

An explanation would be that when atoms are deposited on wall 34 during the epitaxial growth, they tend to accumulate at the level of seams 42 to form quantum dots 60. The forming mechanism of quantum dots 60 is different from the so-called Stranski-Krastanov method, which is implemented on smooth walls. Seams 42 form quantum dot growth sites.

According to an embodiment, the length of a seam 42 is preferably in the range from 1 monolayer, for example, in the order of 0.259 nm for GaN, to 20 monolayers, for example, in the order of 5 nm.

According to an embodiment, distance D1, measured perpendicularly to axis D, between two adjacent seams 42 is greater than 5 nm. This enables to avoid for atoms having reached a seam 42 to escape therefrom. Indeed, the speed of diffusion of an atom on a facet 41 which is not parallel to axis D is generally smaller than the speed of diffusion of an atom on a facet 41 parallel to axis D.

According to an embodiment, distance D2, measured parallel to axis D, between two adjacent seams 42 is shorter than 1 µm. This enables an atom having reached a facet 41 parallel to axis D to diffuse all the way to a seam 42.

The number of edges or of corners 42 depends on the desired distribution of quantum dots 60. According to an embodiment, seams 42 may be distributed substantially homogeneously if a substantially homogeneous distribution of quantum dots 60 is desired. In operation, each quantum dot 60 may emit or receive an electromagnetic radiation. In the case of the emission of a light ray, to obtain a light emission which is perceived by an observer in substantially continuous and homogeneous fashion, the density of seams 42 is greater than $10^8$ seams/cm$^2$.

FIG. 4 shows the structure obtained at a second step of an embodiment of a method of manufacturing active area 40 after having maintained the same epitaxial growth conditions as those which have, at the first step, caused the forming of quantum dots 60. A substantially continuous layer 62 may form and connect quantum dots 60. Layer 62 may have substantially the same composition and the same properties as active area 26 comprising a single quantum well.

According to an embodiment, the method of manufacturing active area 40 may be interrupted after the first step. Active area 40 then only substantially comprises quantum dots 60. Active area 40 may be covered with semiconductor layer 27 which may be in contact with quantum dots 60 and with portion 32 of wire 20. According to another embodiment, the method of manufacturing active area 40 comprises the first and second previously-described steps. Active area 40 then comprises quantum dots 60 and active layer 62. Semiconductor layer 27 which may cover active area 40 is then not in direct contact with portion 32 of wire 20.

In same growth conditions, the composition of a quantum dot 60 differs from the composition of a quantum well. Thereby, the wavelength of the radiation emitted or captured by quantum dots 60 is different from the wavelength of the radiation emitted by a quantum well formed in the same conditions.

As an example, in the case of InGaN, the proportion of indium incorporated in a quantum dot 60 may be greater than the proportion of indium capable of being incorporated in a quantum well formed in the same conditions. Thereby, the wavelength of the radiation emitted by a quantum dot 60 is different from the wavelength of the radiation emitted by a quantum well formed in the same conditions. As an example, the wavelength of the radiation emitted by a single InGaN quantum well with an atomic proportion of indium of 16% is approximately 460 nm and the wavelength of the radiation emitted by InGaN quantum dots formed in the same conditions is approximately 475 nm.

According to an embodiment, optoelectronic device 30 comprises quantum dots 60 where the atomic proportion of the additional element relative to the III-V or II-VI compound is greater than the proportion of this element in a quantum well formed in the same conditions. As an example, in the case of InGaN quantum dots, the atomic proportion of indium is greater than 15%, preferably greater than 20%, more preferably greater than 25%. As an example, in the case of InGaAs quantum dots, the atomic proportion of indium is greater than 40%, preferably greater than 45%, more preferably greater than 50%.

Substrate 14 may correspond to a monoblock structure or correspond to a layer covering a support made of another material. Substrate 14 is preferably a semiconductor substrate, for example, a substrate made of silicon, of germanium, of silicon carbide, of a III-V compound such as GaN or GaAs, or a ZnO substrate. Preferably, substrate 14 is a single-crystal silicon substrate. Preferably, it is a semiconductor substrate compatible with manufacturing methods implemented in microelectronics. Substrate 14 may correspond to a multilayer structure of silicon-on-insulator type, also called SOI.

Substrate 14 may be heavily doped, lightly-doped or non-doped. In the case where the substrate is heavily doped, semiconductor substrate 14 may be doped so as to lower the electric resistivity down to a resistivity close to that of metals, preferably lower than a few mohm·cm. Substrate 14 for example is a heavily-doped substrate having a dopant concentration in the range from $5*10^{16}$ atoms/cm$^3$ to $2*10^{20}$ atoms/cm$^3$. In the case where the substrate is lightly-doped, for example, with a dopant concentration smaller than or equal to $5*10^{16}$ atoms/cm$^3$, preferably substantially equal to $10^{15}$ atoms/cm$^3$, a doped region of the first conductivity type or of a second conductivity type, opposite to the first type, more heavily-doped than the substrate, which extends into substrate 14 from surface 18, may be provided. In the case of a silicon substrate 14, examples of P-type dopants are boron (B) or indium (In) and examples of N-type dopants are phosphorus (P), arsenic (As), or antimony (Sb). Surface 18 of silicon substrate 10 may be a (100) surface.

Electrode 12 may correspond to a conductive layer which extends on surface 16 of substrate 14. The material forming electrode 12 is, for example, nickel silicide (NiSi), aluminum (Al), aluminum silicide (AlSi), titanium (Ti), or titanium silicide (TiSi).

Seed layer 19 is made of a material favoring the growth of semiconductor elements 20. As an example, the material forming seed layer 19 may be a nitride, a carbide, or a boride of a transition metal from column IV, V, or VI of the periodic table of elements, or a combination of these compounds. As an example, seed layer 19 may be made of aluminum nitride (AlN), of aluminum oxide (Al$_2$O$_3$), of boron (B), of boron nitride (BN), of titanium (Ti), of titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate (ZrB$_2$), of zirconium nitride (ZrN), of silicon carbide (SiC), of tantalum carbide nitride (TaCN), of magnesium nitride in Mg$_x$N$_y$ form, where x is approximately equal to 3 and y is approximately equal to 2, for example, magnesium nitride in Mg$_3$N$_2$ form. Seed layer 19 may be doped with the same conductivity type as substrate 14. Seed layer 19 for example has a thickness in the range from 1 to 100 nanometers, preferably in the range from 10 to 30 nanometers.

As a variation, seed layer 19 may be replaced with seed pads resting on surface 18 of substrate 14, each wire 20 resting on one of the seed pads.

When seed layer 19 is made of aluminum nitride, it may be substantially textured and have a preferred polarity. The texturing of seed layer 19 may be obtained by an additional treatment performed after the deposition of the seed layer. It for example is an anneal under an ammonia flow (NH$_3$). In the case of a wire 20 predominantly made of GaN, seed layer 19 may favor the growth of GaN with the N polarity.

Insulating layer 23 may be made of a dielectric material, for example, of silicon oxide (SiO$_2$), of silicon nitride (Si$_x$N$_y$, where x is approximately equal to 3 and y is approximately equal to 4, for example, Si$_3$N$_4$), of silicon oxynitride (particularly of general formula SiO$_x$ N$_y$, for example, Si$_2$ON$_2$), of hafnium oxide (HfO$_2$), or of diamond. As an example, the thickness of insulating layer 23 is in the range from 5 nm to 100 nm, and is for example equal to approximately 30 nm. Insulating layer 23 may have a monolayer structure or may correspond to a stack of two layers or of more than two layers.

Semiconductor layer 27 may comprise a stack of a plurality of layers especially comprising:
   an intermediate layer having a conductivity type opposite to that of lower portion 36 and covering active area 40; and
   a bonding layer covering the intermediate layer and covered with electrode 28.

The intermediate layer, for example, P-type doped, may correspond to a semiconductor layer or to a stack of semiconductor layers and enables to form a P-N or P-I-N junction, active area 40 being located between the intermediate P-type layer and N-type portion 32 of wire 20 of the P-N or P-I-N junction.

The bonding layer may correspond to a semiconductor layer or to a stack of semiconductor layers and enables to form an ohmic contact between the intermediate layer and electrode 28. As an example, the bonding layer may be very heavily doped, with a doping type opposite to that of lower portion 36, until degeneration of the semiconductor layer(s), for example, P-type doped at a concentration greater than or equal to $10^{20}$ atoms/cm$^3$.

The stack of semiconductor layers may comprise an electron barrier layer formed of a ternary alloy, for example, aluminum gallium nitride (AlGaN) or aluminum indium nitride (AlInN) in contact with the active layer and the intermediate layer, to provide a good distribution of electric carriers in the active layer.

Electrode 28 is capable of biasing active area 40 covering each semiconductor element 20 and of letting through the electromagnetic radiation emitted by light-emitting diodes LED. The material forming electrode 28 may be a transparent and conductive material such as indium tin oxide (ITO), zinc oxide, doped or not with aluminum or gallium, or graphene. As an example, electrode layer 28 has a thickness in the range from 5 nm to 200 nm, preferably from 20 nm to 50 nm.

When a voltage is applied between electrodes 12 and 28, a light ray is emitted by active area 40. When active area 40 has the structure shown in FIG. 3 and only comprises quantum dots 60, the emitted radiation is substantially monochromatic. When active area 40 has the structure shown in FIG. 4 and comprises quantum dots 60 and active layer 62, the wavelength of the radiation emitted by quantum dots 60 is different from the radiation emitted by active layer 62 and light-emitting diode LED of optoelectronic device 30 may emit a radiation with two different wavelengths.

A device having wideband emission or reception properties can thus be obtained. In particular, the obtained emission or reception spectrum may be characteristic of white light.

FIG. 5 is a cross-section view of another embodiment of an optoelectronic device 70. Device 70 comprises all the elements of optoelectronic device 30 shown in FIG. 2, with the difference that wire portion 32 having a rough lateral wall 34 is continued by a wire portion 72 having a smooth lateral wall 74, which may have the same structure as portion 22 of optoelectronic device 10 shown in FIG. 1. Portion 72 has a height H$_W$ in the range from 10 nm to 10 µm. Portion 72 is covered with an active layer 76 which may have the same structure and the same composition as active area 26 of optoelectronic device 10 shown in FIG. 1.

In the embodiment shown in FIG. 5, the light radiation emitted by active layer 76 which covers portion 72 of wire 20 originates from an electroluminescence phenomenon. The light radiation emitted by active area 40 which covers portion 32 of wire 20 originates from a phenomenon of photoluminescence by conversion of part of the light radiation emitted by active layer 76 of adjacent wires 20. According to an embodiment, active area 40 may be non-continuous, that is, not totally cover rough lateral wall 34.

Each light-emitting diode LED of optoelectronic device 70 can thus emit at two different wavelengths.

FIG. 6 shows another embodiment of an optoelectronic device 80 which comprises all the elements of device 70, with the difference that portion 72 of wire 20 having a smooth lateral wall 74 is located between lower portion 36 and portion 32 of wire 20 having a rough lateral wall 34.

Figure 7:
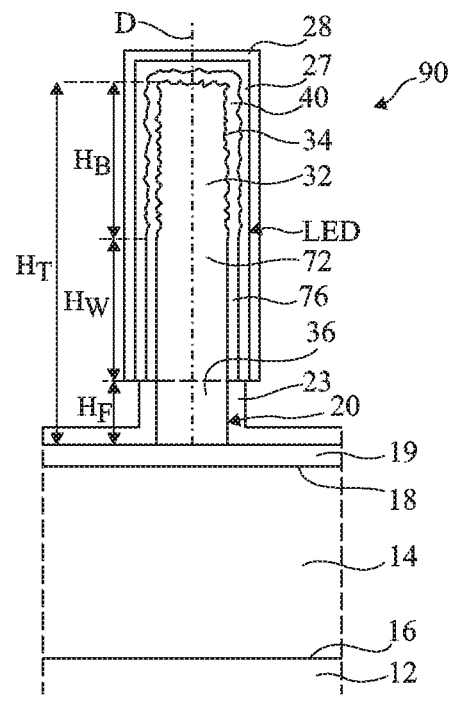

FIG. 7 shows another embodiment of an optoelectronic device 90 which comprises all the elements of device 80 shown in FIG. 6, with the difference that semiconductor layer 27 and electrode layer 28 cover portion 72 of wire 20 having a smooth wall 74 and portion 32 of wire 20 having a rough wall 34.

Figure 8:
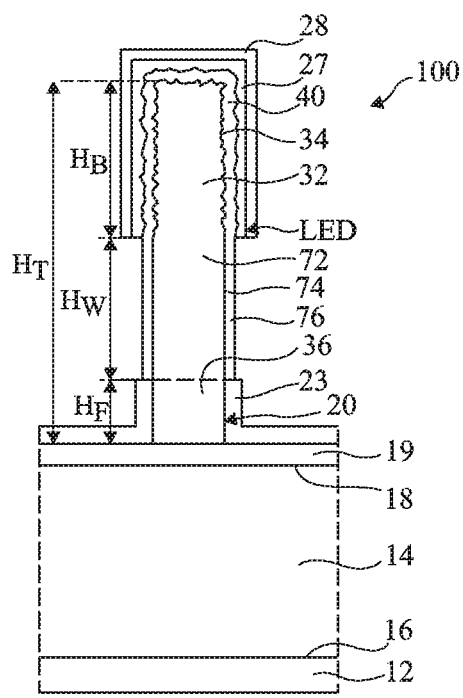

FIG. 8 shows another embodiment of an optoelectronic device 100 which comprises all the elements of device 80 shown in FIG. 6, with the difference that semiconductor layer 27 and electrode layer 28 only cover portion 32 of wire 20 having a rough wall 34 and do not cover portion 72 of wire 20 having a smooth wall 74.

Figure 9:
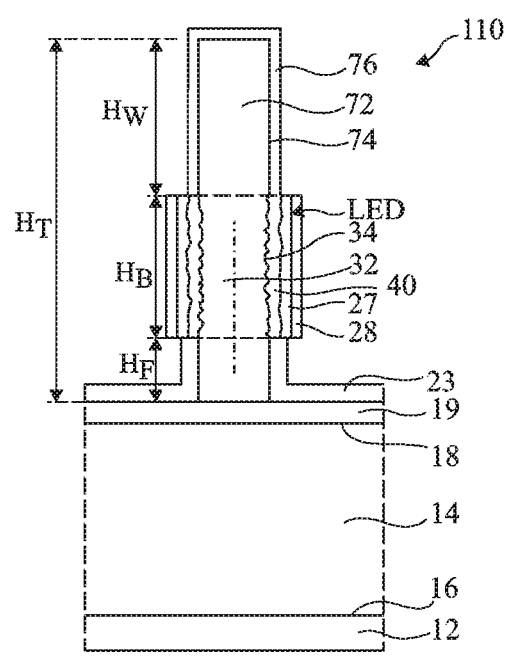

FIG. 9 shows another embodiment of an optoelectronic device 110 which comprises all the elements of device 70 shown in FIG. 5, with the difference that semiconductor layer 27 and electrode layer 28 only cover portion 32 of wire 20 having a rough wall 34 and do not cover portion 72 of wire 20 having a smooth wall 74.

The embodiments shown in FIGS. 5 and 6 have the advantage of a more efficient current injection with less leakage. An explanation would be that the active layer is more homogeneous and that the quantum dots, which convert part of the light emitted by the active layer, emit at a higher wavelength. The emitted spectrum is then wider and more stable according to the voltage applied to the light-emitting diodes.

According to an embodiment, the rough wall, 34, is formed after the growth of each wire 20 by chemical etching of the sides of wire 20. The possible portions of wire 20 having lateral walls which should remain smooth, for example, portion 72 in FIG. 5, are then protected against etching, for example, by being covered with a protection layer which is removed after the etch step.

The wire growth method may be a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), or hydride vapor phase epitaxy (HVPE) may be used. However, electrochemical processes may be used, for example, chemical bath deposition (CBD), hydrothermal processes, liquid aerosol pyrolysis, or electrodeposition.

As an example, the method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia ($NH_3$), tertiarybutylphosphine (TBP), arsine ($AsH_3$), or unsymmetrical dimethylhydrazine (UDMH). Call III/V ratio of the gas flow of the precursor of the group-III element to the gas flow of the precursor of the group-V element.

According to an embodiment of the invention, in a phase of growth of the wires of the III-V compound, a precursor of an additional element is added, in addition to the precursors of the III-V compound. The presence of the precursor of the additional element results in the incorporation of the additional element into the III-V compound to dope this III-V compound, but also in the forming of a layer of a dielectric material predominantly made of the additional element and of the group-V element on the lateral sides of the growing crystals of the III-V compound. The additional element may be silicon (Si). An example of a precursor of silicon is silane ($SiH_4$). This enables to dope the N-type wires. This may further cause the forming of a dielectric layer of silicon nitride SiN, possibly in stoichiometric form $Si_3N_4$, on the lateral walls of the wire. The ratio of the silane flow to the trimethylgallium flow, expressed in mol/min, is generally in the range from $8*10^{-5}$ to $2*10^{-3}$, for example, approximately $4.10^{-4}$. The thickness of the obtained $Si_3N_4$ dielectric layer is then generally smaller than 10 nm.

As an example, in the case where upper portion 36 is made of heavily-doped N-type GaN, a MOCVD-type method may be implemented by injection, into a showerhead-type MOCVD reactor, of a gallium precursor gas, for example, trimethylgallium (TMGa) and of a nitrogen precursor gas, for example, ammonia ($NH_3$). As an example, a showerhead-type 3×2" MOCVD reactor commercialized by AIXTRON, may be used. A molecular flow ratio between trimethylgallium and ammonia within the 5-200 range, preferably within the 10-100 range, enables to favor the growth of wires. As an example, a carrier gas which ensures the diffusion of metal-organic elements all the way into the reactor becomes laden with metal-organic elements in a TMGa bubbler. The latter is adjusted according to the standard operating conditions. A flow of 60 sccm (standard cubic centimeters per minute) is for example selected for TMGa, while a 300-sccm flow is used for $NH_3$ (standard $NH_3$ bottle). A pressure of approximately 800 mbar (800 hPa) is used. The gaseous mixture further comprises silane injected into the MOCVD reactor, which material is a precursor of silicon. The silane may be diluted in hydrogen at 1,000 ppm and a 20-sccm flow is provided. The temperature in the reactor is for example in the range from 950° C. to 1,100° C., preferably from 990° C. to 1,060° C. To transport species from the outlet of the bubblers to the two reactor plenums, a 2,000-sccm flow of carrier gas, for example, $N_2$, distributed between the two plenums, is used. The previously-indicated gas flows are given as an indication and should be adapted according to the size and to the specificities of the reactor.

According to an embodiment, rough wall 34 is obtained by introducing an excess of hydrogen ($H_2$) into the reactor after the growth of wires 20. Although hydrogen is conventionally used as a carrier gas in the reactor, the inventors have shown that an excess of hydrogen may cause an etching of the lateral walls of the wires and an increase in the roughness of these walls.

According to an embodiment, after the wire growth, the reactor is placed under a $H_2$ pressure, for example, at a 0.8-bar (80 kPa) pressure for 5 min. The forming of asperities on the walls of wire 20 exposed to the etching is obtained.

According to an embodiment, rough wall 34 is obtained by a partial etching of the dielectric layer covering wire 20 and which forms during the growth of wire 20, to partially expose wire 20. The etching may be performed by introducing an excess of hydrogen ($H_2$) into the reactor after the growth of wires 20. The exposed areas of the wire form quantum dot growth sites. According to an embodiment, for N-type doped GaN wires, after the wire growth, the trimethylgallium flow is interrupted while the silane flow is maintained alone, for example, for 5 minutes. The reactor is then placed under a $H_2$ pressure, for example, at a 0.8-bar (80 kPa) pressure for 5 min.

According to an embodiment, for N-type doped GaN wires, the ratio of the silane flow to the trimethylgallium flow is increased. Indeed, the inventors have shown that the growth mechanism of the silicon nitride layer is modified when the silane is strongly in excess, which results in obtaining an uneven $Si_3N_4$ layer exposing areas of the GaN wire, thus forming nucleation areas for the quantum dots. The exposed areas of the GaN wire form quantum dot growth sites. As an example, the ratio of the silane flow to the trimethylgallium flow, expressed in mol/min, is greater than $10^{-3}$.

According to another embodiment, for N-type doped GaN wires, the silane flow is decreased so that the $Si_3N_4$ layer, which forms on the wire, is not continuous and comprises openings which expose areas of wire 20, the exposed areas forming quantum dot growth sites. For this purpose, the ratio of the silane flow to the trimethylgallium flow, expressed in mol/min, may be smaller than $5*10^{-4}$.

According to another embodiment, rough wall 34 is formed along the growth of each wire 20.

FIG. 10 shows another embodiment of an optoelectronic device 120 after the step of forming wires 20 and before the step of forming active area 40. Portion 32 comprises a succession of portions 122, 124, 126 having substantially constant cross-sections and different diameters, each portion being connected to the next one by a step 128, that is, by a surface substantially perpendicular to axis D of wire 20. The edges at the seam between steps 128 and portions 122, 124, 126 form quantum dot growth sites. As a variation, steps 128 may be inclined with respect to axis D.

According to an embodiment of the method of manufacturing device 120, the growth parameters of wire 20 are changed in stepped fashion between two portions 122, 124, 126 of different diameters. As an example, the III/V ratio passes, in stepped fashion, from an initial constant value to a final constant value, between two portions 122, 124, 126 having different diameters.

FIG. 11 shows another embodiment of an optoelectronic device 130 after the step of forming wires 20 and before the step of forming active area 40. Portion 32 comprises a doped core 132 surrounded with a substantially non-doped shell 133 comprising a succession of portions 134, 135, 136, 137 having inclined walls connected by steps 138. The edges at the seam between steps 138 and portions 134, 135, 136, 137 form quantum dot growth sites.

According to an embodiment of the method of manufacturing device 130, for N-type doped GaN wires, after the forming of doped core 132, the silane flow is interrupted and the flows of the precursors of gallium and of nitrogen are maintained. The temperature is decreased, for example, from 1,000° C. to 750° C. in successive stages. This causes the forming of shell 133 from the top of the wire with successive steps 138. The diameter of shell 133 decreases from the top of wire 20.

FIG. 12 shows another embodiment of an optoelectronic device 140 after the step of forming wires 20 and before the step of forming active area 40. Portion 32 of wire 20 is formed of an alternation of doped portions 142, for example, made of N-type doped GaN, and of non-doped portions 144, for example, made of GaN. Non-doped portions 144 have a greater diameter than doped portions 142. The edges at the junctions between non-doped portions 144 and doped portions 142 form quantum dot growth sites.

Various methods may be used to form GaN portions 144 having diameters different from that of the doped GaN portions 142. For this purpose, if portions 142 of doped GaN are formed with given operating parameters of the growth reactor are formed, operating parameters of the reactor are modified for the forming of GaN portions 144. According to an embodiment, the pressure is modified and/or the relative composition of the precursors of group-III elements and of the precursors of group-V elements is modified. More specifically, a decrease of the pressure in the reactor on forming of a GaN portion 144 with respect to the pressure used to form the underlying doped GaN portion 142 causes an increase in the diameter of GaN portion 144 with respect to the underlying doped GaN portion 142. Further, an increase in the V/III ratio with respect to the V/III ratio used to form the underlying doped GaN portion 142 causes an increase in the diameter of GaN portion 144 with respect to underlying portion 142.

It should be noted that if the parameter variation is abrupt, there is an abrupt diameter variation. However, if this parameter variation is progressive, there may exist an intermediate conical area between the portions of microwires or nanowires of different diameter. The intermediate area is formed of semi-polar planes.

FIG. 13 shows another embodiment of an optoelectronic device 150 after the step of forming wires 20 and before the step of forming active 40. In this embodiment, each semiconductor element corresponds to a pyramid 152. The inventors have shown that for certain conditions of growth of pyramids 152, certain sides of the pyramids are rougher than others. As an example, FIG. 13 shows a less rough side 154 and a rougher side 156. The asperities of rougher side 156 are capable of forming quantum dot growth sites while an active layer comprising quantum dots may be formed on less rough side 154.

In the case of a semiconductor element corresponding to a pyramid 152 predominantly made of GaN, seed layer 19 may favor the growth of GaN with the Ga polarity. According to an embodiment of the method of manufacturing device 150, ratio V/III is low, for example, smaller than 50. This causes the forming of pyramids comprising smooth sides and rough sides. To increase the roughness of the rough sides, after the growth of the pyramids, the flows of the precursors of the V and III elements may be interrupted and the growth reactor may be placed under a hydrogen pressure, for example, at 0.8 bar for 10 minutes. This causes a stronger increase in the roughness of side 156 with respect to side 154.

Specific embodiments have been described. Various alterations and modifications will occur to those skilled in the art. In particular, although the drawings show embodiments where the wires, covered with a first electrode, are formed on a first surface of a support while a second electrode is formed on a second surface of the support, opposite to the first surface, it should be clear that the second electrode may be provided on the side of the first surface. Further, although the more detailed previously-described embodiments relate to III-V compounds, what has been described may also be implemented to manufacture II-VI compounds.

Various embodiments with different variations have been described hereabove. It should be noted that those skilled in the art may combine various elements of these various embodiments and variations without showing any inventive step. In particular, the specific shapes of portions 32 having a rough wall of FIGS. 10 to 12 may be implemented with some of the embodiments of optoelectronic devices 70, 80, 90, 100, and 110 described in relation with FIGS. 5 to 9.

The invention claimed is:

1. An optoelectronic device, comprising:
three-dimensional semiconductor elements predominantly made of a first compound selected from the group comprising III-V compounds, II-VI compounds, and IV compounds, each semiconductor element delimiting at least a first surface comprising contiguous facets angled with respect to one another, the optoelectronic device comprising quantum dots at at least some seams between facets, the quantum dots being predominantly made of a mixture of the first compound and of an additional element and being capable of emitting or of receiving a first electromagnetic radiation at a first wavelength; and
for each three-dimensional semiconductor element, an active layer comprising at least a single quantum well or multiple quantum wells and capable of emitting or of receiving a second electromagnetic radiation at a second wavelength different from the first wavelength;
wherein the active layer covers the quantum dots, the quantum dots being located between the three-dimensional semiconductor element and the active layer.

2. The optoelectronic device of claim 1, comprising a second surface, distinct from the first surface, said active layer covering the second surface.

3. The optoelectronic device of claim 1, wherein each quantum dot is predominantly made of a $In_xAl_yGa_{1-x-y}N$ compound, where $0 \leq x \leq 1$, $0 \leq y \leq 1$ and $1-x-y>0$.

4. The optoelectronic device of claim 1, wherein the semiconductor elements are nanowires, microwires, and/or nanometer- or micrometer-range pyramidal structures.

5. The optoelectronic device of claim 1, wherein the semiconductor elements have a shape elongated along a preferred direction, and wherein a distance, measured perpendicularly to the preferred direction, between two seams of pairs of adjacent seams is greater than 5 nm.

6. The optoelectronic device of claim 5, wherein the distance, measured parallel to the preferred direction, between two adjacent seams is smaller than 1 µm.

7. The optoelectronic device of claim 5, wherein a density of seams is greater than $10^8$ seams/cm$^2$.

8. A method of manufacturing an optoelectronic device, comprising the steps of:

forming three-dimensional semiconductor elements predominantly made of a first compound selected from the group comprising III-V compounds, II-VI compounds, and IV compounds, each semiconductor element delimiting at least a first surface comprising contiguous facets angled with respect to one another;
forming quantum dots at at least some seams between facets, the quantum dots being predominantly made of a mixture of the first compound and of an additional element and being capable of emitting or of receiving a first electromagnetic radiation at a first wavelength; and
forming, for each three-dimensional semiconductor element, an active layer covering the quantum dots such that the quantum dots are located between the three-dimensional semiconductor element and the active layer, the active layer comprising at least a single quantum well or multiple quantum wells and capable of emitting or of receiving a second electromagnetic radiation at a second wavelength different from the first wavelength.

9. The method of claim 8, comprising forming semiconductor elements and partially etching the semiconductor elements to form the first surface.

10. The method of claim 8, wherein the first surface is formed simultaneously to the growth of the semiconductor elements.

11. The optoelectronic device of claim 1, further comprising insulating portions partially covering said semiconductor elements.

12. The method of claim 8, wherein forming three-dimensional semiconductor elements predominantly made of a first compound selected from the group comprising III-V compounds, II-VI compounds, and IV compounds, each semiconductor element delimiting at least a first surface comprising contiguous facets angled with respect to one another comprises:

forming three-dimensional semiconductor elements predominantly made of a first compound selected from the group comprising III-V compounds, II-VI compounds, and IV compounds, each semiconductor element delimiting, with insulating portions partially covering said semiconductor element, at least a first surface comprising contiguous facets angled with respect to one another.

* * * * *